(12) United States Patent
Subramani et al.

(10) Patent No.: US 6,406,599 B1
(45) Date of Patent: Jun. 18, 2002

(54) MAGNETRON WITH A ROTATING CENTER MAGNET FOR A VAULT SHAPED SPUTTERING TARGET

(75) Inventors: Anantha Subramani, San Jose; Umesh Kelkar, Sunnyvale; Jianming Fu, San Jose; Praburam Gopalraja, Sunnyvale, all of CA (US)

(73) Assignee: Applied Materials, Inc., Santa Clara, CA (US)

( * ) Notice: Subject to any disclaimer, the term of this patent is extended or adjusted under 35 U.S.C. 154(b) by 0 days.

(21) Appl. No.: 09/703,738

(22) Filed: Nov. 1, 2000

(51) Int. Cl.$^7$ ............................................. C23C 14/34
(52) U.S. Cl. ........................... 204/298.09; 204/298.12; 204/298.17; 204/298.18; 204/298.19; 204/298.2; 204/298.21; 204/298.22
(58) Field of Search ..................... 204/298.09, 298.12, 204/298.17, 298.18, 298.19, 298.2, 298.21, 298.22

(56) References Cited

U.S. PATENT DOCUMENTS

| 4,622,121 A | * 11/1986 | Wegmann et al. ..... 204/298.18 |
| 4,746,417 A | * 5/1988 | Ferenbach et al. ..... 204/298.19 |
| 5,512,150 A | 4/1996 | Bourez et al. ........... 204/192.2 |
| 6,179,973 B1 | * 1/2001 | Lai et al. ............... 204/192.12 |

FOREIGN PATENT DOCUMENTS

| JP | 59-215484 | * 5/1983 |
| JP | 2-4966 | * 1/1990 |

* cited by examiner

Primary Examiner—Rodney G. McDonald
(74) Attorney, Agent, or Firm—Charles S. Guenzer

(57) ABSTRACT

A plasma sputter reactor including a target with an annular vault formed in a surface facing the wafer to be sputter coated and having inner and outer sidewalls and a roof thereover. A well is formed at the back of the target between the tubular inner sidewall. A magneton associated with the target includes a stationary annular magnet assembly of one vertical polarity disposed outside of the outer sidewall, a rotatable tubular magnet assembly of the other polarity positioned in the well behind the inner sidewall, and a small unbalanced magnetron rotatable over the roof about the central axis of the target. The lower frame supports the target while the upper frame supports the magnetron, including the magnets adjacent the lower frame. The inner magnet assembly has a cooling water passage passing to the bottom of the inner magnet to inject the cooling water to the bottom of the well. The cooling water is stirred by the rotating roof magnetron and leaves the water bath through inlets formed in the bottom frame but exits from the top frame.

24 Claims, 4 Drawing Sheets

MAGNETRON WITH A ROTATING CENTER MAGNET FOR A VAULT SHAPED SPUTTERING TARGET

RELATED APPLICATION

This application is related to concurrently filed patent application VAULT SHAPED TARGET AND MAGNETRON OPERABLE IN TWO SPUTTERING MODES by P. Gopalraja et al. Ser. No. 09/703,601, incorporated herein by reference in its entirety.

FIELD OF THE INVENTION

The invention relates generally to plasma sputtering of materials. In particular, the invention relates to the target and associated magnetron creating a magnetic field to enhance sputtering.

BACKGROUND ART

Sputtering, alternatively called physical vapor deposition (PVD), is the most prevalent method of depositing layers of metals and related materials in the fabrication of semiconducting integrated circuits. In sputtering of metals and metal compounds, a metallic target is typically biased negatively to attract ions to the target at such high energies that the ions dislodge or sputter atoms from the target, and these sputtered atoms coat the wafer placed in opposition to the target. One of the most challenging applications of sputtering is to deposit metal into a narrow and deep hole, that is, one have a high aspect ratio. Such holes may be via holes connecting two levels of metallization through an intervening dielectric layer. In advanced circuitry, via holes may have aspect ratios of 5:1 or greater with via diameters of 0.18 $\mu$m or less.

Sputtering is fundamentally a ballistic process which is ill suited to reach deep within high-aspect ratio holes. The sputtered metal tends to build up on the lip of the hole and bridge the hole before the hole is filled, thereby forming voids in the metallization within the hole.

Sputtering may be used in several applications. In one recently developed technology, copper is used as the metallization in place of aluminum to achieve several benefits. Copper has a lower electrical resistivity and is less prone to electromigration that is aluminum. Further, copper is easily and economically filled into high-aspect ratio hole by electro-chemical plating (ECP). However, prior to plating copper, the via hole needs to be lined with a thin copper seed layer both to initiate the plated layer and to act as an electrode in the electro-plating process. The seed layer requires only a few nanometers of copper, but the thickness needs to be fairly uniform from the top to the bottom of the via sidewall. Sputtering can also be used for depositing thin barrier layers into the via holes, for example, a barrier of Ta/TaN for copper fill, but this application will not be further discussed in any detail.

Several sputtering procedures are known for accomplishing a nearly conformal coating of metal into high aspect-ratio holes. Unfortunately, most of them tend to involve expensive equipment or require excessive operating times because of the slow effective deposition rates in high-aspect ratio holes. However, a recently developed sputtering technology, called SIP+ and developed by Applied Materials, Inc. of Santa Clara, Cali., produces many advantages for coating metal, particularly copper, into high aspect-ratio holes and in integrated circuit structures greatly desired for advanced electronics. SIP+ is a modification of SIP, which stands for self-ionized plasma. Fu et al. describes a version of SIP in U.S. patent application, Ser. No. 09/373, 097, filed Aug. 12, 1999 and now issued as U.S. Pat. No. 6,183,614. In SIP, various modifications are made to a standard DC magnetron sputter reactor to achieve a high-density metal plasma and to guide the metal ions to the wafer. Some of the techniques include high target power, in particular, high effective target power densities in the area of the magnetron, and small but strong magnets scanned about the back of the generally planar target. The design of the magnetron is also critical. These techniques increase the plasma density adjacent to the sputter target with the result that a significant fraction of the sputtered atoms become ionized. Two principal effects are obtained. First, the sputtered metal ions can act at least partially as the ions sputtering the target so that the pressure of argon typically used as a sputter working gas can be reduced. In the extreme case possible with copper, called sustained self-sputtering, the argon can be completely eliminated once the plasma has been excited. Secondly, various techniques can be used to guide and accelerate the metal ions to deep within the high aspect-ratio holes.

SIP+, as described by Fu et al. in U.S. patent application, Ser. No. 09/490,026, filed Jan. 21, 2000 and now issued as U.S. Pat. No. 6,251,242, relies upon a target having a novel complex shape rather than the conventional planar shape used in SIP. Fu et al. describe subsequent developments in SIP+ in U.S. patent application, Ser. No. 09/518,180, filed Mar. 2, 2000 and now issued as U.S. Pat. No. 6,277,249. The SIP+ target has a deep annular groove or vault formed in its side facing the substrate. Various magnet configurations are possible involving anti-parallel magnets placed on the sidewalls of the vault and/or a nested ring magnet placed over the vault roof and rotated along the path of the closed vault.

Nonetheless, further improvements are desired.

A self-ionized plasma requires large amounts of power to be applied to the target. The irregularly shaped vaulted target typically used in SIP+ tends to develop hot spots which are difficult to cool, particularly in the presence of the large number of magnets typically used.

Self-ionized plasmas, particularly with vaulted targets, require strong magnetic fields having somewhat complex shapes. Care must be taken to assure that the fields do not create very uneven erosion patterns in the target. Uniform erosion patterns are desired. Otherwise, the most heavily sputtered portion of the target may be eroded completely through while a large amount of target material remains in other regions of the target. Targets, particularly ones having the complex vaulted shape, are expensive to fabricate, and their lifetimes should be increased by a more uniform erosion pattern.

Although a high ionization fraction is often required for sputtering into high-aspect, holes, a complex device interconnect structure like dual damascene may require a more involved deposition sequence or different thickness of different portions of the deposited film.

Sputtering targets need to be occasionally replaced after they have been significantly eroded. Target replacement in SIP+ reactors is more difficult because the target tends to be relatively heavy, about 40 kg, and there are many magnets, some or all of which may be configured to rotate with associated motors and shafts, which factors increase the complexity, difficulty, and precision needed to change a target. Both the magnet design and chamber configuration need to facilitate the quick, economical replacement of the target.

SUMMARY OF THE INVENTION

According to one aspect of the invention, anti-parallel sets of magnets are disposed completely around the inner and outer sidewalls of an annular vault formed in the target, and a small nest of opposed magnets is rotated over the roof of the vault. Advantageously, the set of magnets disposed about for the outer sidewall is stationary and the set for the inner sidewall, although substantially circular, is rotated together with the roof magnets.

According to a further aspect of the invention, the inner vault sidewall magnets are divided into two axial parts of the same polarity which are separated by a non-magnetic spacer, thereby providing magnetic field over a larger area of the inner vault sidewall.

According to another aspect of the invention including the rotating center magnet, cooling liquid is pumped through the shaft upon which the inner sidewall magnets are supported and rotated and exits the shaft into a gap between the bottom of the inner sidewall magnets and the flattened portion of the target within the ring of stationary magnets surrounding the outer sidewall of the vault. Advantageously, the cooling water exits the space behind the target through apertures set in the outer vault sidewall near the bottom of the vault.

According to yet another aspect of the invention, the chamber wall surrounding the vaulted target and magnetron is composed of two parts. The vault shaped target is fixed to the bottom part of the chamber wall, while the magnets are supported on the top part of the chamber wall, which also supports the chamber lid and other parts associated with the rotating magnets. The cooling water port to the exterior is advantageously also on the top part. Thereby, when the target needs to be replaced, the entire upper assembly, including both upper chamber wall parts, is lifted from the chamber bottom. Then, the bottom chamber wall part and target are separated from the upper chamber wall part and associated other elements, and a replacement set of bottom chamber wall part and target are substituted.

DETAILED DESCRIPTION OF THE PREFERRED EMBODIMENTS

Figure 1:
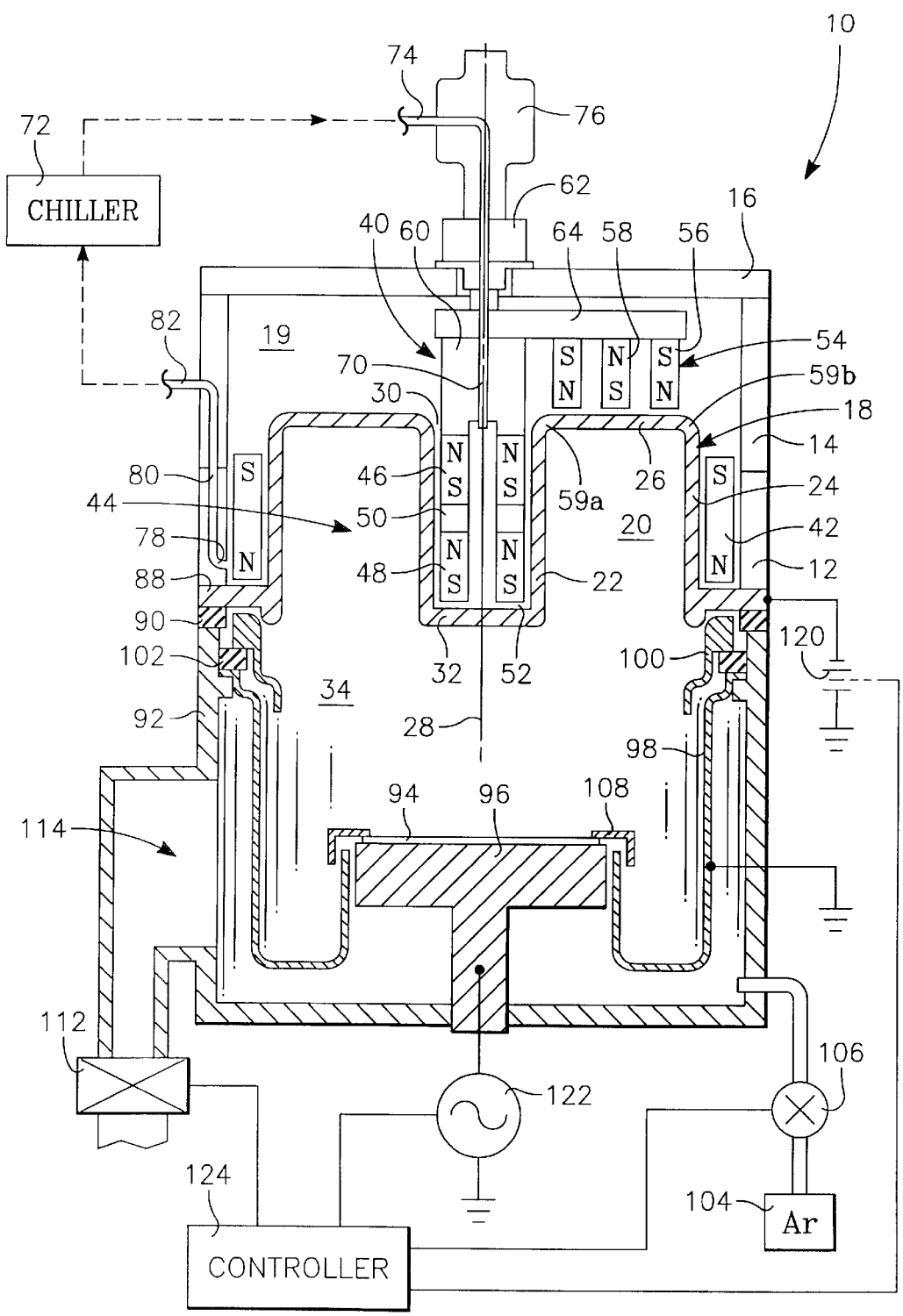
FIG. 1 is a schematic cross-sectional view of an embodiment of a plasma sputter reactor of the invention.

FIG. 1 is a schematic cross-sectional representation of a plasma sputter reactor 10 of the invention. This illustration is not complete, and further details are included in other drawings to be described later. Most of the parts of the reactor 10 are described in the above cited patents and patent applications to Fu et al. The overall reactor 10 will be briefly described with emphasis included for the inventive parts.

The upper chamber includes a cylindrical wall composed of a bottom frame 12 and a top frame 14, which supports a chamber roof 16. An SIP+ vault-shaped target 18 is fixed to the bottom frame 12. The top frame 14 and chamber roof 16 are sealed together to allow cooling water to form a bath that circulates in a space 19 in back of the target 18. The vault-shaped target includes an annular vault 20 having an inner sidewall 22, an outer sidewall 24, and a vault roof 26, all generally circularly symmetric with respect to a vertical chamber axis 28. The inner and outer vault sidewalls 24 extend generally parallel to the chamber axis 28 while the vault roof 26 extends generally perpendicularly thereto. That is, the vault 20 is annularly shaped with a generally rectangular cross section. The vault 20 has an aspect ratio of axial depth to radial width typically of at least 1:2 and preferably at least 1:1. A generally cylindrical well 30 is formed within the cylindrical inner sidewall 24 and is defined at its bottom by a flattened target portion 32 facing a processing space 34 of the reactor.

A magnetron 40 is placed in back of the vaulted target 18 in close association with the vault 20. The magnetron 40 includes a stationary ring-shaped outer sidewall magnet assembly 42 placed outside the outer vault sidewall 24 and having a first vertical magnetic polarity. The preferred structure for the outer sidewall magnets 42 is more complicated than that illustrated, as will be described later, but the function remains much the same. A rotatable inner sidewall magnet assembly 44 includes an upper tubular magnet 46 and a lower tubular magnet 48 separated by a non-magnetic tubular spacer 50 having an axial length at least half the separate axial lengths of the two tubular magnets 46, 48. The two tubular magnets 46, 48 have a same second vertical magnetic polarity opposite that of the outer sidewall magnet assembly 42. The bottom of the lower tubular magnet 48 is separated from the back of the planar portion 32 of the vaulted target 18 by a small gap 52 having an axial extent of between 0.5 to 1.5 mm.

The magnetron also includes a rotatable roof magnet assembly 54 in a nested arrangement of an outer ring magnet 56, generally circularly shaped, having the first magnetic polarity surrounding an inner rod magnet 58 having the second magnetic polarity. It is preferred, although not required, that the magnetic polarity of the outer ring magnet 56 be anti-parallel to that of the inner sidewall magnet 44 so as to avoid strong magnetic fields adjacent to the inner upper comer 59a of the target vault 20 and to instead intensify the magnetic field at the outer upper comer 59b, which is being more quickly scanned. The total magnetic flux of the outer ring magnet 56 is advantageously greater than that of the inner ring rod magnet 58, producing an unbalanced magnetron part.

Both the inner sidewall magnet assembly 44 and the roof magnet assembly 54 are rotatable about the chamber axis 28. The inner sidewall magnet assembly 44 is connected to and supported by a shaft 60 rotated about the chamber axis 28 by a motor 62. The roof magnet assembly 54 includes a magnetic yoke 64, which is fixed to the rotating shaft 60.

The motor shaft 60 and the inner sidewall magnet 44 includes an inner passageway 70 configured for passage of cooling fluid, usually water, supplied from a chiller 72 through an inlet port 74 to a rotary union 76 connected to the motor shaft 60. The cooling water flows through the shaft 60 to exit therefrom near the bottom of the inner sidewall magnet assembly 44, and thence flows through the gap 52 at the bottom of the inner sidewall magnet assembly 44. It then flows upwardly between the inner vault sidewall 24 and the inner sidewall magnet assembly 44. The rotating roof magnet assembly 54 stirs up the cooling water in the region about the back of the target 18, thereby increasing its turbulence and cooling efficiency. The cooling water then flows down next to the outer vault sidewall 22. As will be explained later, the tubular outer sidewall magnet assembly 42 is composed of a large number of rod magnets, and they are separated from the actual walls of the target 18. As a result, the cooling water can flow both through and below the outer sidewall magnet assembly 42 to one of several bath outlet ports 78 in the bottom frame 12 and then through several risers 80 in the frames 12, 14 to an outlet port 82 in the upper frame 14, whence the warmed cooling water is returned to the chiller 72. This cooling design has the advantage of supplying the coldest water to the hottest, central portions of the target 18.

These parts of the upper chamber will be described in more detail later after the lower chamber and the sputtering operation has been briefly described.

A rim 88 of the target 18 is supported through a dielectric isolator 90 on a metallic lower chamber wall 92. A wafer 94 to be sputter coated is supported on a pedestal electrode 96 in opposition to the target 18. A grounded shield 98 is supported on and grounded to the lower chamber wall 92. It acts both to protect the lower chamber wall 92 from sputter deposition and to provide a grounded anode for the sputtering plasma. An electrically floating shield 100 is supported through a second dielectric isolator 102 on the lower chamber wall 92 above the grounded shield 98 and close to the target 18. Negative electrical charge built up on the floating shield 100 repels the plasma electrons and thus reduces electron loss from the plasma near the target 18.

A sputter working gas such as argon is supplied from a gas source 104 through a mass flow controller 106 to the area in back of the grounded shield 98. It flows through a gap formed between the pedestal 96, the grounded shield 98, and a plasma ring 108 to the processing space 34 between the pedestal 96 and the target 18. The pressure in the vacuum chamber is maintained by a vacuum pump system 112 connected to the chamber in back of the grounded shield 98 through a pumping port 114. Although the chamber has a base pressure in the neighborhood of $10^{-8}$ Torr, in typical sputtering operation not involving complete sustained self-sputter, the chamber pressure is typically held between 0.1 and 5 milliTorr.

The plasma is initiated by flowing argon into the chamber and igniting it into a plasma by supplying DC voltage from a DC power supply 120 connected to the target 18. Although a higher voltage is needed for ignition, a plasma is maintained with a target voltage of about −400 to −700VDC. Especially in the case of sputtering copper, once the plasma has been ignited, the supply of argon may be reduced or even eliminated. The pedestal electrode 96 may left electrically floating, in which case it nonetheless builds up a negative DC bias. On the other hand, the DC self-bias can be increased and controlled by applying RF power from an RF bias supply 122 to the pedestal electrode 96. An electronic controller 124 controls the two power supplies 120, 122, the argon mass flow controller 106, and the vacuum system 112 according to the recipe developed for the desired sputtering process.

Figure 2:
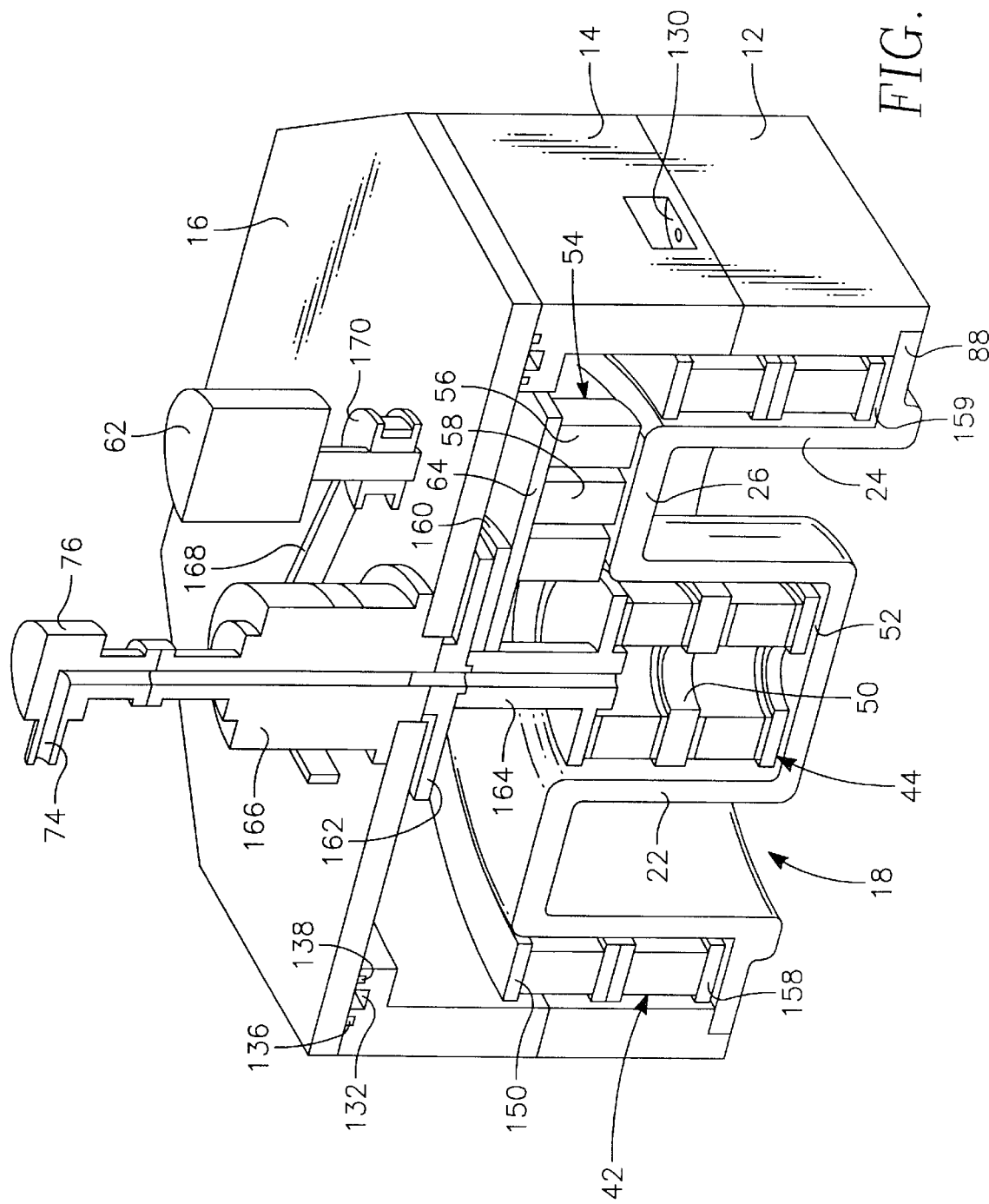
FIG. 2 is a sectioned orthographic view of the upper chamber of the reactor of FIG. 1.
Figure 3:
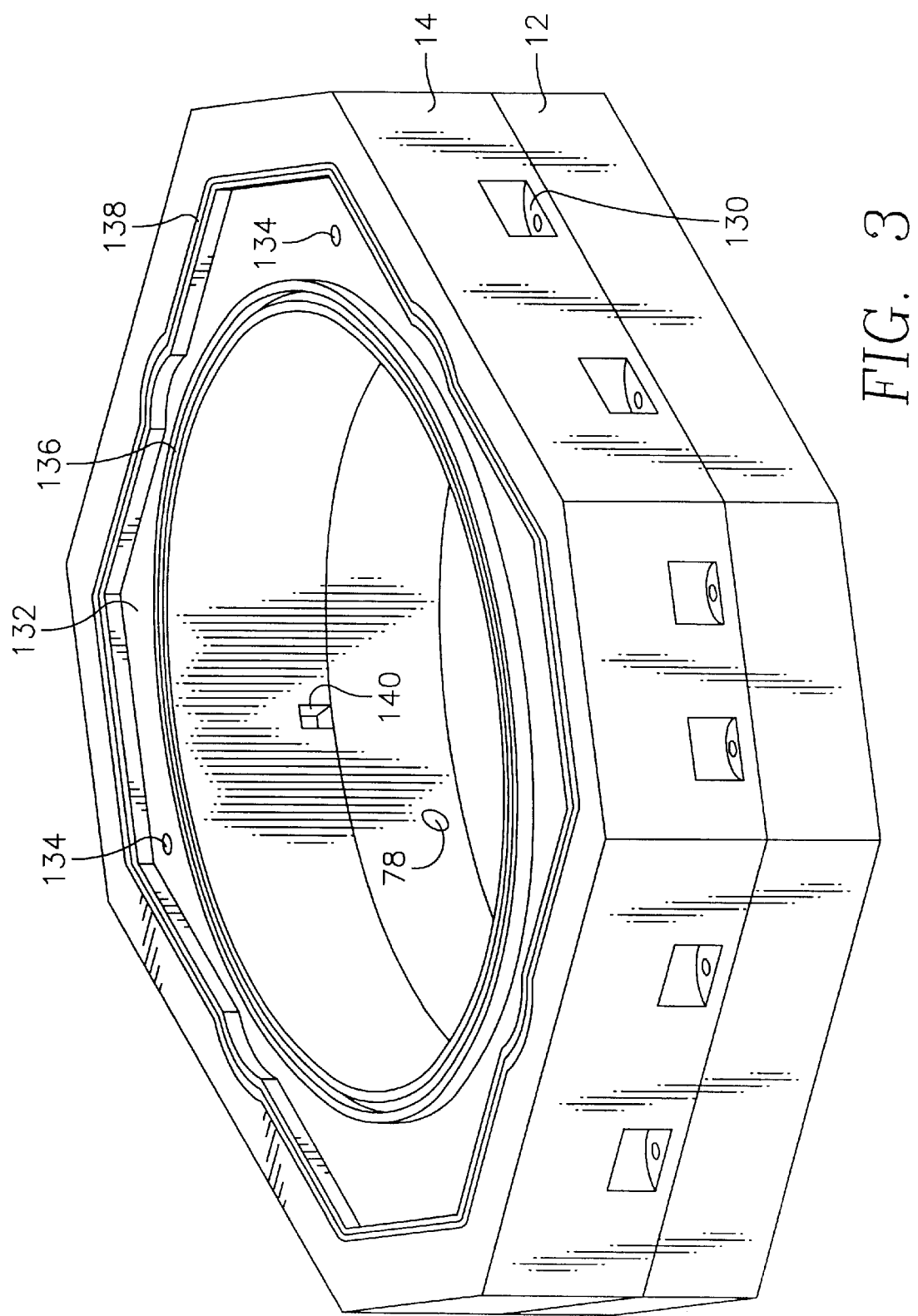
FIG. 3 is an orthographic view of the two frames forming the sidewalls of the upper chamber of FIG. 2.

The lower and upper frames 12, 14 of the upper chamber and the associated magnetron assembly are illustrated in the sectioned orthographic view of FIG. 2. Only the upper and lower frames 12, 14 are illustrated in the orthographic view of FIG. 3. The two frames 12, 14 are fixed together across an unillustrated O-ring seal by bolts which can be accessed from the sides of the upper chamber through external cavities 130 formed in the upper frame 14. A cooling water manifold 132 (FIG. 3) is formed at the top of the upper frame 14 and is connected to the four bath outlets 78 near the bottom of the lower frame 12 through the four previously mentioned risers 80 entering the cooling water manifold 132 through riser ports 134. The single cooling water outlet to the chiller 72 is formed by two unillustrated holes which are bored respectively from the bottom of the water manifold 132 and from the outside of the upper frame 14 and which meet within the upper frame 14. A vacuum sealing O-ring is placed in an O-ring groove 136 between the cooling water manifold 132 and the chamber interior, and a water sealing O-ring is placed in an O-ring groove 136 on the outside of the cooling water manifold 132. Both O-rings seal to the chamber roof 16 when it is bolted to the top of the upper frame 14. The flange 88 of the target 18 is connected through bolts and seals located at the unillustrated bottom of the lower frame 12.

Figure 4:
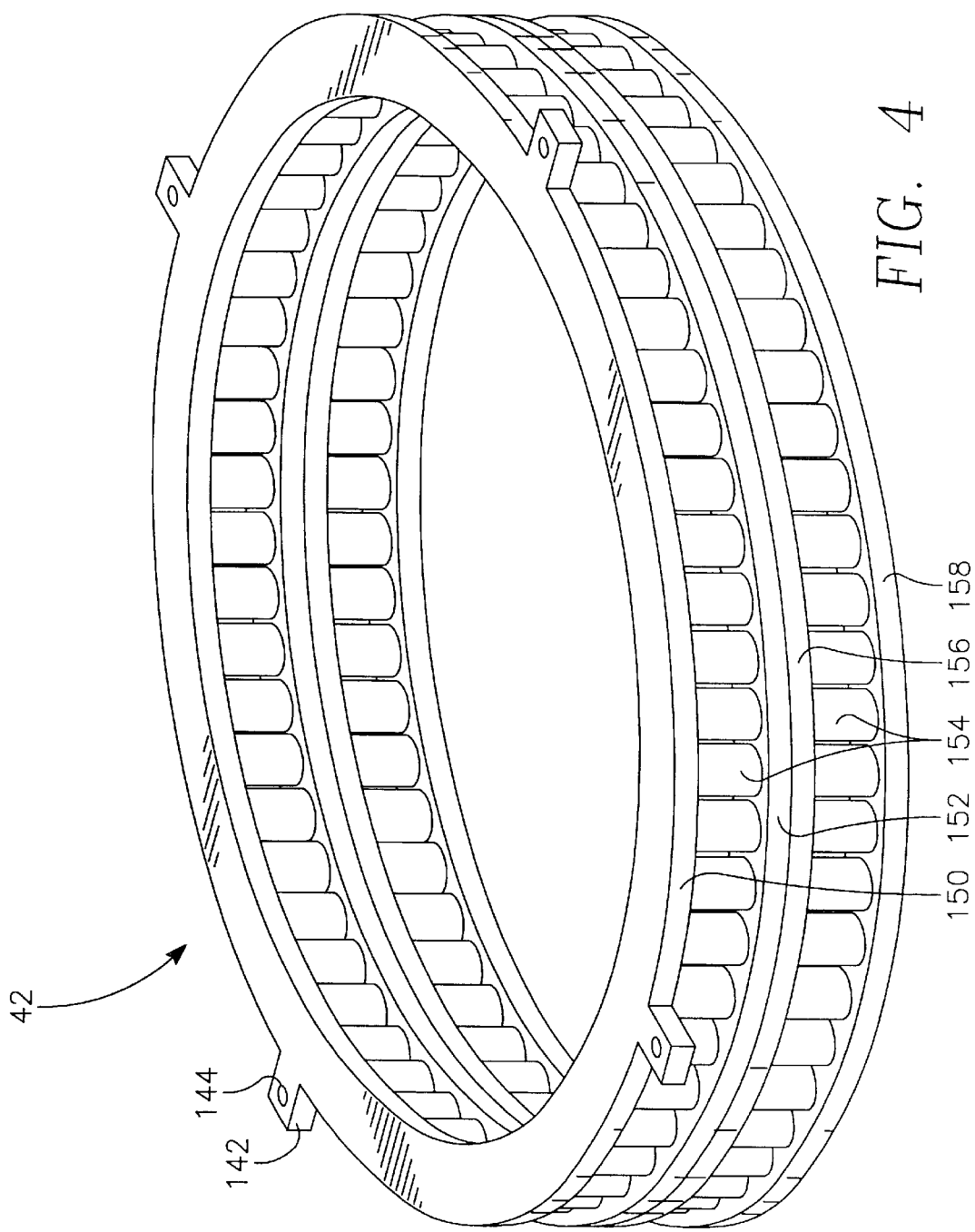
FIG. 4 is an orthographic view of one of the magnet assemblies.

Four internal, open-bottom recesses 140 are formed at the bottom of the upper frame 14 inside of the inter-frame seal to provide space for four tabs 142, illustrated in the orthographic view of FIG. 4, extending outwardly from the top of the outer inner sidewall magnet assembly 42. When the two frames 12, 14 are separated when the bolts in the external access cavities 130 are unscrewed, screws or bolts entering through holes 144 in the tabs can be inserted and removed from the exposed lower opening of the internal recesses 140. The tab screws are inverted with their heads at the bottom and are screwed into screw holes tapped into the roof portion of the internal recesses 140 of the upper frame 14. Thereby, even though the outer sidewall magnet 42 primarily extends along the lower frame 12, it is fixed to the upper frame 14. Furthermore, the side attachment allows the outer sidewall magnet 42 to be supported above the bottom of the target 18.

The outer sidewall magnet assembly 42 is a dual-layer structure, illustrated in FIG. 4, each including multiple rod magnets and yokes. The dual layers allow easier assembly of very strong magnets. The upper layer includes an upper magnetic yoke ring 150, including the outwardly extending tabs 142, and a lower magnetic yoke ring 152. Yokes are typically machined from SS410 stainless steel, which has a high magnetic permeability. Each yoke ring 150, 152 is partially bored with receiving holes to accept, align, and fix through unillustrated screws approximately fifty rod magnets 154 arranged about the rings. The lower layer includes a similar arrangement of magnetic yoke rings 156, 158 and rod magnets 154. The two layers are fixed together by unillustrated screws. The various screws are not completely necessary in view of the strong magnetic coupling involved, but they prevent accidents from occurring. All magnets are composed of a strongly magnetic material, such as NdBFe and are encapsulated, as has been described by Fu in the previously cited SIP patent. They are assembled into the illustrated outer sidewall magnet 42 to have the same magnetic polarity.

Returning to FIG. 2, the outer sidewall magnet assembly 42 is stationary supported above the target flange 88 with an intervening small gap 159 and extends essentially along the entire length of the target outer sidewall 24. Although the outer sidewall magnet assembly 42 is composed of two levels of multiple magnets, because the magnets are all similarly aligned and because of the annular band-shaped yokes, the outer sidewall magnet assembly 42 acts as a single tubular magnet magnetically polarized along its axis.

The inner sidewall magnet assembly 44 is rotating but, because of its circularly symmetric shape, it provides an essentially stationary magnetic field. It also extends in parallel to and along substantially all of the vault inner sidewall 22. However, if desired, the non-magnetic spacer 50 modifies the magnetic field distribution from that expected of a tubular magnet.

The roof magnet assembly 52 has a substantially circular shape and occupies only a fraction of the circumference of the planar area of the vault roof 26, but the roof magnet assembly 52 is rotated around the vault roof 26. The annular outer magnet 56 and the cylindrical inner magnet 58 are fixed by screws to the magnetic yoke 64, which also serves as a support. A non-magnetic mounting block 160, for example, composed of aluminum, fixedly connects the magnetic yoke 64 of the roof magnet assembly 52 to a non-magnetic mounting ring 162, for example, composed of SS303 stainless steel. The mounting ring 162, which has an inner axial passage, forms part of the rotation shaft. A non-magnetic spindle 164, for example, composed of aluminum, also has an inner axial passageway and provides a mechanical connection between the mounting ring 162 and the inner sidewall magnet assembly 44. On its upper end, the mounting ring is fixed to a bearing and pulley assembly 166 sealed to the chamber roof 16. A belt 168 is wrapped around the bearing and pulley assembly 166 and a pulley 170 fixed to the shaft of the motor 62. Thereby, the motor 62 rotates the roof magnet 52 and the inner sidewall magnet 44. The rotary union 76, nonetheless, allows cooling water to be supplied from the stationary water inlet 74. Various mechanical support and protective features are not specifically illustrated but are easily obtained by the ordinary designer.

An advantage of the mechanical structure derives from the fact that the vaulted target is relatively heavy, on the order of 40 kg, and is located beneath a complex and heavy magnetron assembly. In contrast, conventional planar targets are much lighter, and their magnetrons are much simpler. The conventional planar target is replaced by manually removing the chamber lid over the target and attached magnetron and then manually lifting the target, a process nearly infeasible with a vaulted target and the illustrated magnetron. Instead, it is possible with the present design as best viewed in FIG. 2 to use an overhead hoist to lift the two frames 12, 14 together with attached target 18 and magnetron assembly from the lower chamber body and to deposit them on a bench or cart. There, the technician separates the two frames 12, 14 by unscrewing the bolts in the access holes 130. The target remains fixed to the lower frame 12, and all the parts of the magnetron remain fixed to the upper frame 14 as do the water fittings. The hoist is again used to transfer the upper frame 14 from the old lower frame 12 and target 18 to a new lower frame and target. Once the frames 12, 14 are refastened, the hoist returns them to the lower chamber. Although this process requires multiple lower frames, these are relatively simple and thus inexpensive.

Different features of the invention may be applied to sputtering apparatus other than the one illustrated in FIG. 1. Other magnet configurations are described in the concurrently filed applications. The rotatable inner sidewall magnet is usable with a rotatable outer sidewall magnet, even one extending only part way around the vault circumference. The divided upper chamber is useful with other magnetron configurations.

The features described above provide improved cooling and maintenance for a high-performance but complex plasma sputter reactor without unduly complicating the design.

What is claimed is:

1. A sputter target and magnetron assembly configured to be attached to a plasma sputter reactor having a pedestal for supporting a substrate to be sputter coated, comprising:
   a sputter target comprising at least a surface of a material to be sputtered and having formed therein an annular vault arranged about a central axis of said reactor and facing said pedestal, said vault having an inner sidewall, an outer sidewall, and a roof, a well being formed on a backside of said target within said inner sidewall;
   a first generally cylindrical magnet rotatable about said central axis placed in said well and having a cooling liquid passage passing therethough parallel to said central axis; and
   a second magnet placed outside of said outer sidewall.

2. The assembly of claim 1, wherein a gap of between 0.5 and 1.5 mm is formed between a bottom of said first magnet and a bottom wall of said well.

3. The assembly of claim 1, wherein said second magnet is annular.

4. The assembly of claim 3, wherein said second magnet is stationary.

5. The assembly of claim 1, further comprising a motor shaft extending along said central axis, supporting said first magnet, and having a cooling liquid passageway passing axially therethrough and in communication with said passage of said first magnet.

6. The assembly of claim 1, further comprising a third magnet positioned over said roof of said vault and rotatable about said central axis together with said first magnet.

7. The assembly of claim 6, wherein said roof magnet comprises an annular outer magnet of one magnetic polarity surrounding an inner magnet of another magnetic polarity.

8. The assembly of claim 1, further comprising an upper chamber including:
   a lower frame detachably fixable to a portion of said target extending radially outwardly from a bottom of said outer sidewall;
   an upper frame detachably fixable to said lower frame;
   a first cooling liquid port formed in said upper frame;
   at least one second cooling liquid port formed in lower portions of said outer sidewalls; and
   risers formed through said upper and lower frames connecting said first cooling liquid port and said at least one second cooling liquid port.

9. The assembly of claim 8, further comprising a chamber roof sealable against a top of said upper frame, whereby said first magnet rotates in and said second magnet is disposed within a liquid bath of a cooling liquid admitted through said cooling liquid passage and delivered out through said at least one second cooling liquid port.

10. A magnetron sputter reactor, comprising:
    a pedestal disposed in a lower chamber for supporting a substrate to be sputter coated;
    an upper chamber;
    a sputter target sealed to a bottom of said upper chamber, supported on said lower chamber, and comprising at least a surface of a material to be sputtered and having formed therein an annular vault arranged about a central axis of said reactor and facing said pedestal, said vault having an inner sidewall, an outer sidewall, and a roof, a well being formed on a backside of said target within said inner sidewall;
    a first magnet assembly placed in said well and having a cooling liquid passage passing therethrough for carrying a cooling liquid to within said well; and
    at least one first cooling liquid port formed in said chamber at a level of a bottom portion of said outer sidewall.

11. The reactor of claim 10, wherein said cooling liquid passage passes through said first magnet assembly parallel to said central axis to deliver said cooling liquid to a bottom wall of said well.

12. The reactor of claim 10, wherein said first magnet is generally cylindrical.

13. The reactor of claim 12, wherein said first magnet assembly is rotatable about said central axis.

14. The reactor of claim 10, further comprising a chiller receiving said cooling liquid from said at least one cooling liquid outlet and supplying chilled cooling liquid to said cooling liquid passage.

15. The reactor of claim 10, wherein said upper chamber comprises:
  a lower frame in which said at least one first cooling liquid port is formed;
  an upper frame sealed to said lower frame and including a second cooling liquid port; and
  at least one riser formed in said upper and lower frames connecting respective ones of said at least one first cooling liquid port to said second cooling liquid port.

16. The reactor of claim 15, wherein said at least one first cooling liquid port inlet comprises at least two first cooling liquid ports.

17. A plasma sputter reactor, comprising:
  a sputter target symmetrically arranged about a central axis and comprising at least a surface of a material to be sputtered in opposition to a pedestal for supporting a substrate to be sputter deposited;
  a lower frame having a generally cylindrical first inner wall about said central axis and partially forming a closed chamber in back of said target and to which said target is detachably fixable;
  an upper frame having a generally cylindrical second inner wall about said central axis and partially forming said closed chamber and detachably fixable to said lower frame away from a front of said target; and
  a magnetron positioned on a back of said target, disposed radially inside of said first and second inner walls with respect to said central axis, and supported on said upper frame.

18. The reactor of claim 17, wherein said target has formed therein an annular vault arranged about a central axis of said reactor and facing said pedestal, said vault having an inner sidewall, an outer sidewall, and a roof connecting tops of said inner and outer sidewalls.

19. The reactor of claim 18, wherein target further comprises a flange extending radially outwardly from a bottom of said outer sidewall, and wherein said flange is detachably fixable to said lower frame.

20. The reactor of claim 17, wherein said magnetron comprises an annular magnet detachably supportable on said upper frame and axially extending along a major portion of said lower frame.

21. The reactor of claim 17, wherein said closed chamber forms a cooling liquid bath.

22. The reactor of claim 21, wherein said cooling liquid bath contacts said target and magnets of said magnetron.

23. A cooling system for a sputtering target which has formed therein an annular vault arranged on a front side thereof about a central axis, said vault having an inner sidewall, an outer sidewall, and a roof, a well being formed on a back side of said target within said inner sidewall, said system comprising:
  a housing sealable to said back side of said target for forming a cooling liquid bath contacting said inner and outer sidewalls, said roof, and walls of said well;
  a first cooling liquid port formed adjacent a bottom of said well closer to said front side of said target for ejecting a cooling liquid into said cooling liquid bath; and
  at least one second cooling liquid port formed in said housing facing one or more portions of said outer sidewalls nearer to said front side of said target for removing said cooling liquid from said cooling liquid bath.

24. The cooling system of claim 23, wherein said first cooling liquid port is formed in a bore of a magnet assembly disposed in said well and rotatable therein about said central axis.

* * * * *